United States Patent
Mabuchi et al.

[19]

[11] Patent Number: 6,092,486
[45] Date of Patent: Jul. 25, 2000

[54] PLASMA PROCESSING APPARATUS AND PLASMA PROCESSING METHOD

[75] Inventors: Hiroshi Mabuchi, Amagasaki; Toshihiro Hayami, Nishinomiya; Shigeki Honda, Sagamihara, all of Japan

[73] Assignee: Sumimoto Metal Indsutries, Ltd., Osaka, Japan

[21] Appl. No.: 09/013,258

[22] Filed: Jan. 26, 1998

Related U.S. Application Data

[63] Continuation of application No. PCT/JP97/01756, May 22, 1997.

[30] Foreign Application Priority Data

May 27, 1996 [JP] Japan ..................... 8-131819

[51] Int. Cl.$^7$ ..................... C23C 16/00; C23C 14/00; C23F 1/02
[52] U.S. Cl. ..................... 118/723 MW; 118/724; 156/345; 204/298.34
[58] Field of Search ..................... 156/345; 118/723 MW, 118/723 ME, 723 E, 723 R, 723 I, 723 AN, 724; 204/298.38, 298.34; 427/571, 575

[56] References Cited

U.S. PATENT DOCUMENTS

| | | | |
|---|---|---|---|
| 5,545,258 | 8/1996 | Katayama et al. | 118/723 MP |
| 5,580,384 | 12/1996 | Thiebaud et al. | 118/723 E |
| 5,846,332 | 12/1998 | Zhao et al. | 118/728 |
| 5,961,850 | 10/1999 | Satou et al. | 216/67 |

FOREIGN PATENT DOCUMENTS

| | | |
|---|---|---|
| 831680 A1 | 3/1998 | European Pat. Off. . |
| 4-123257 | 6/1992 | Japan . |
| 5-144773 | 6/1993 | Japan . |
| 6-104098 | 4/1994 | Japan . |
| 6151334A | 5/1994 | Japan . |
| 7118860A | 5/1995 | Japan . |
| 7-335567 | 12/1995 | Japan . |
| 8-311666 | 11/1996 | Japan . |

*Primary Examiner*—Paul Thibodeau
*Assistant Examiner*—Sheeba Ahmed
*Attorney, Agent, or Firm*—Armstrong, Westerman, Hattori, McLeland & Naughton

[57] ABSTRACT

The plasma processing apparatus and plasma processing method of the present invention are suitable for the application of plasma processing to etching, ashing, CVD, etc. in the manufacturing of large scale integrated circuits (LSIs) and liquid crystal display panels (LCDs), and useful for the manufacturing of LSIs and LCDs. The apparatus is characterized in that the reaction chamber has its side wall separated into an inner side wall which faces to the interior of the reaction chamber and an outer side wall which faces to the exterior of the reaction chamber, with the inner side wall being isolated electrically from other portions of the reaction chamber and not grounded electrically. This structure improves the repeatability of plasma processing. The apparatus is also characterized in that the inner side wall of reaction chamber is isolated thermally from other portions of the reaction chamber and equipped with temperature control means. This structure improves the temperature control performance for the inner side wall and also improves the maintainability of the apparatus.

13 Claims, 4 Drawing Sheets

PLASMA PROCESSING APPARATUS AND PLASMA PROCESSING METHOD

This application is a continuation of international application PCT/JP97/01756 filed May 22, 1997.

TECHNICAL FIELD OF THE INVENTION

The present invention relates to a plasma processing apparatus and plasma processing method using the apparatus, the apparatus and method being applied to processes of etching, ashing, chemical vapor deposition (CVD), etc. in the manufacturing of large scale integrated circuits (LSIs) and liquid crystal display panels (LCDs).

BACKGROUND ART OF THE INVENTION

Plasma processing apparatus are used widely in the manufacturing of LSIs, LCDs, etc. The plasma processing apparatus carry out processes of etching, ashing, CVD, etc. based on the formation of plasma of reactive gases. Particularly, the dry etching technique using plasma is an indispensable fundamental technique for the manufacturing processes of LSIs, LDCs, etc.

The recent manufacturing of LSIs, LCDs, etc. uses larger silicon wafers and glass substrates, and the generation of uniform plasma in a wide area is required intensively. In regard to the dry etching technique and embedment technique for thin film formation, it is required to control plasma generation and ion energy in plasma independently.

In order to satisfy these requirements, the applicant of the present invention has already proposed a plasma processing apparatus which can generate plasma uniformly in a wide area and also can control the ion energy (refer to Japanese patent publication JP-A-He-5-144773). The proposed apparatus has the structure in which the ceiling section of the reaction chamber is airtightly sealed with a dielectric plate having the microwave transmissivity (will be termed "microwave window" hereinafter), a dielectric substance layer in which the microwave is propagated is provided above the microwave window, and a radio frequency (RF) voltage can be applied to the sample stage.

Based on the adoption of the above-mentioned structure, this apparatus can propagate the microwave flatly in the dielectric substance layer. Accordingly, by increasing the area of the dielectric substance layer and microwave window, it is readily possible to generate plasma uniformly in a large area of the reaction chamber. With the application of RF voltage to the sample stage in the reaction chamber, an electrical circuit is formed between the sample stage and the grounded section through the plasma, and a bias voltage can be generated on the sample surface. This apparatus can control the ion energy of plasma based on the bias voltage. Namely, based on the generation of plasma mainly by the microwave and the control of plasma ion energy mainly by RF voltage, it is possible to control plasma generation and plasma ion energy independently.

However, this apparatus cannot generate a stable bias voltage on the surface of a sample placed on the sample stage in some plasma processing condition, in which case the control of ion energy will be difficult. For example, the etching process for oxide films cannot be done at a satisfactory repeatability, and moreover etching does not progress or a thin film deposits on the sample in some cases.

On this account, the applicant of the present invention has proposed an apparatus which is capable of controlling the ion energy stably (refer to Japanese patent publication JP-A-He-6-104098).

FIG. 1 shows a vertical cross-section of the proposed plasma processing apparatus which is intended to perform the ion energy control stably. The apparatus is provided, on the microwave window 14 on the interior side of the reaction room 12, with a counter electrode 21 which is grounded electrically. The counter electrode 21 is a metallic plate of aluminum (Al), etc., and it has a microwave entry hole 21a for introducing the microwave into the reaction room 12.

The proposed apparatus shown in FIG. 1 is characterized to have the grounded counter electrode 21 disposed near the microwave window 14, where most of plasma is generated, to confront the sample stage 15. This electrode disposition stabilizes the plasma potential at the application of RF voltage to the sample stage 15, producing a stable bias voltage on the surface of the sample S. Consequently, it becomes possible to control the ion energy of plasma so that the surface of the sample S is exposed to ion of appropriate energy.

FIG. 2 shows a detail of portion A of the apparatus shown in FIG. 1, i.e., the side wall section of the reaction chamber. The counter electrode 21 is grounded electrically through the side wall section of the reaction chamber 11. Provided on this section are a heater 27 and another heater 31, by which the side wall of the reaction chamber 11 and the counter electrode 21 are heated to the specified temperatures.

However, in this structure of apparatus, the side wall of the reaction chamber is also grounded electrically, and therefore the side wall can possibly work as a grounded electrode for the sample stage having the application of RF voltage. On this account, the state of RF voltage application between the counter electrode and sample stage and between the side wall of reaction chamber and sample stage may vary, resulting possibly in a significant degradation of repeatability of plasma processing. For example, in the case of etching $SiO_2$ on the surface of a silicon wafer, the distribution of etching rate across the sample surface may deteriorate abruptly.

It is important for various plasma processings to maintain the specified temperature of the inner side wall of the reaction chamber under temperature control. For example, the above-mentioned $SiO_2$ etching uses fluorocarbon (CxFy) gas, and it is necessary to gather film formation seeds, which are created by the decomposition in plasma, to the sample surface in order to improve the selection ratio to the Si undercoat film. On this account, the sample is cooled by cooling the sample stage, while the side wall of the reaction chamber is heated to 150° C. to 200° C., under temperature control.

Since the apparatus of the above-mentioned arrangement is subjected to temperature control for the entire side wall of the reaction chamber, the heat produced by the control diffuses to the entire reaction chamber. Therefore, the temperature control for the inner side wall, on the other hand, is inefficient and insufficient. Moreover, the temperature control based on heating heats up the outer side (facing to the atmosphere) of the reaction chamber, making it difficult the access to the apparatus for the maintenance.

SUMMARY OF THE INVENTION

The present invention is intended to resolve the foregoing problems, and its primary object is to provide a plasma processing apparatus and plasma processing method capable of stabilizing the plasma processing thereby to improve the repeatability of processing, and its secondary object is to improve the temperature control for the side wall of the reaction chamber and improve the maintainability of the apparatus.

The plasma processing apparatus of the present invention comprises means of supplying a microwave, a reaction chamber, a microwave window provided in the ceiling section of the reaction chamber, a sample stage disposed in the reaction chamber to confront the microwave window, means of applying RF voltage to the sample stage, and a counter electrode which is located near the microwave window to confront the sample stage and grounded electrically, wherein the reaction chamber has its side wall separated into an inner side wall which faces to the interior of the reaction chamber and an outer side wall which faces to the exterior of the reaction chamber, with the inner side wall being isolated electrically from other portions of the reaction chamber and not grounded electrically.

The plasma processing method of the present invention comprises the operational steps of introducing a microwave into a reaction chamber in which processing gas has been fed, thereby causing the gas to form plasma, and applying RF voltage to a sample stage on which a sample is placed thereby to produce a bias voltage on the sample surface, so that the sample is exposed to ion, wherein the inner side wall of reaction chamber which faces to the interior of the reaction chamber is isolated electrically from other portions of the reaction chamber and not grounded electrically.

The adoption of these plasma processing apparatus and plasma processing method eliminates the dispersion of RF power from the sample stage toward the side wall of reaction chamber, which event has been encountered by the conventional apparatus, thereby attaining the effective application of RF voltage between the counter electrode and sample stage. Consequently, the bias voltage produced on the sample surface by the application of RF voltage is stabilized, and the repeatability of plasma processing is improved.

The inventive plasma processing apparatus is in addition characterized in that the reaction chamber has its inner side wall isolated thermally from other portions of the reaction chamber and equipped with temperature control means.

The inner side wall of reaction chamber can have efficient and stable temperature control owing to the control which is exclusive to other portions. The temperature variation of the outer side wall (facing to the atmosphere) of the reaction chamber caused by the temperature control for the inner side wall is alleviated, and the maintenance problem is resolved.

The above-mentioned structure is particularly suitable for an apparatus having its counter electrode provided to exist only in the rim section of the microwave window inside the reaction chamber, e.g., an apparatus having an annular counter electrode.

The apparatus having such a counter electrode alleviates the problem of the sticking of particles to the sample and the metallic contamination owing to the absence of electrode over the sample stage, but on the other hand, it is liable to suffer from increased dispersion of RF power from the sample stage to the side wall since the counter electrode does not directly confront the sample stage. The above-mentioned structure is intended to alleviate the dispersion of RF power from the sample stage to the side wall of the reaction chamber, and the pronounced effectiveness is proved by the apparatus.

The plasma processing method of the present invention is in addition characterized in that the inner side wall of the reaction chamber is equipped with individual temperature control means and isolated thermally from other portions of the reaction chamber. Consequently, the inner side wall is rendered the efficient and stable temperature control, and the temperature variation of the outer side wall (facing to the atmosphere) of the reaction chamber caused by the temperature control for the inner side wall is alleviated, resulting in an improved maintainability of the apparatus.

BRIEF DESCRIPTION OF THE DRAWING FIGURES

DETAILED DESCRIPTION OF THE INVENTION

The plasma processing apparatus of the present invention will be explained in detail.

Figure 1:
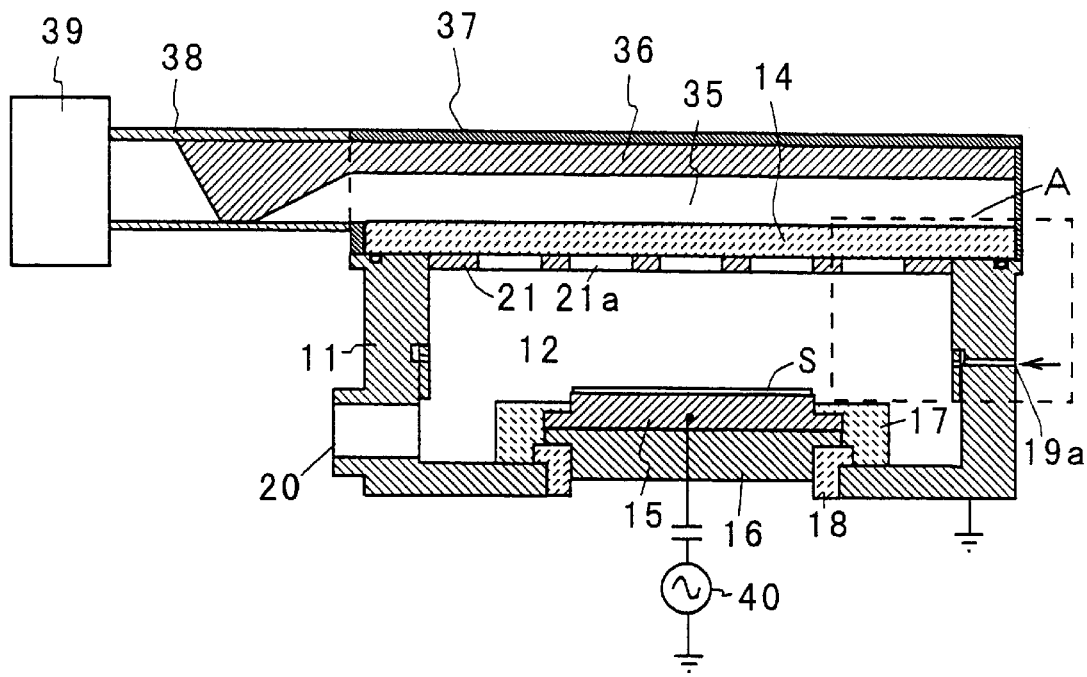
FIG. 1 is a vertical cross-sectional view of the plasma processing apparatus proposed in the past.
Figure 2:
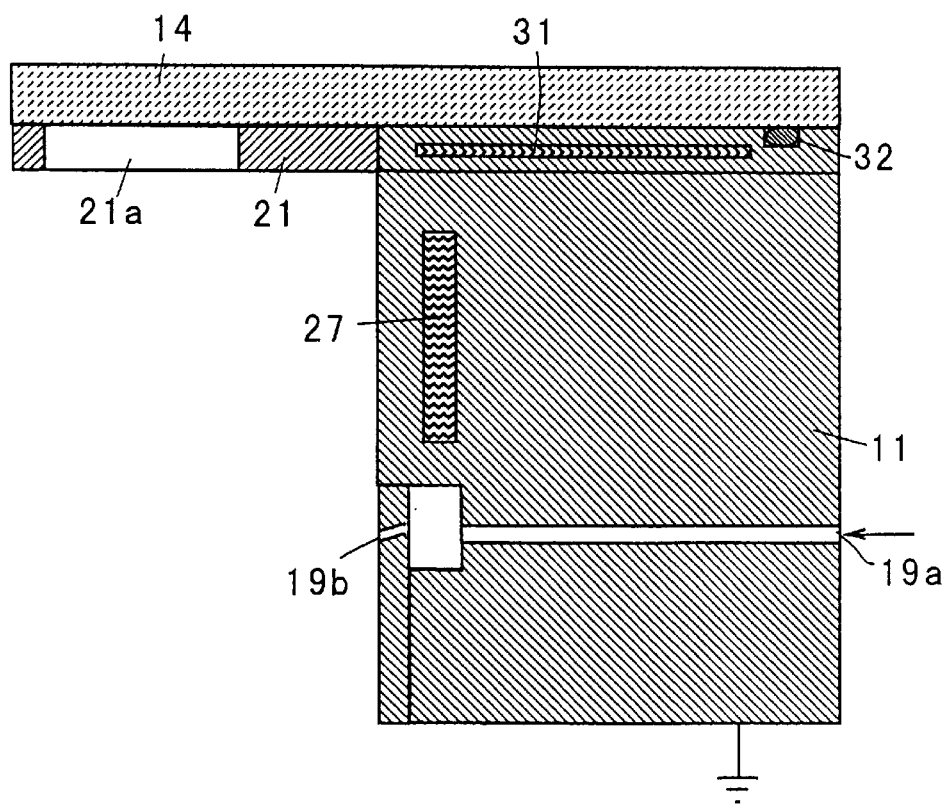
FIG. 2 is an enlarged view of portion A of the apparatus shown in FIG. 1, i.e., the side wall section of the reaction chamber.
Figure 3:
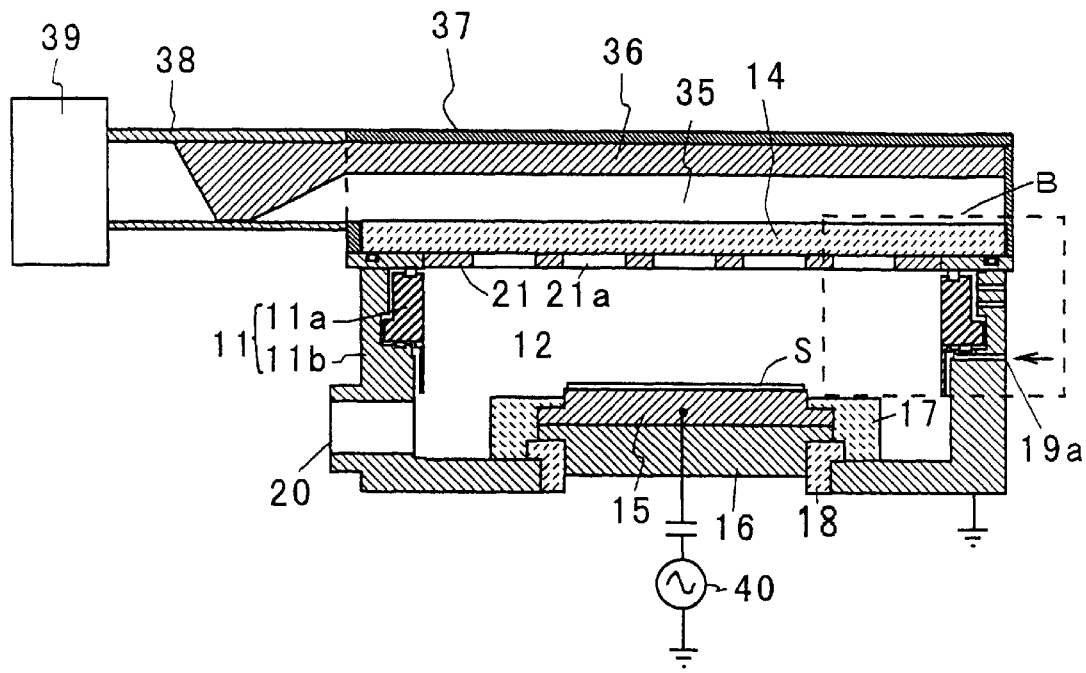
FIG. 3 is a vertical cross-sectional view of the plasma processing apparatus based on an embodiment of the present invention.

FIG. 3 shows a vertical cross-section of the plasma processing apparatus based on an embodiment of the present invention. The apparatus has a cuboidal reaction chamber 11 which is made of metal such as aluminum or stainless steel. The reaction chamber 11 has a reaction room 12 in it. The reaction chamber 11 is covered atop with a microwave window 14 and an O-ring so that it is airtightly sealed. The microwave window 14 is made of a dielectric substance, such as quartz glass ($SiO_2$) or alumina ($Al_2O_3$), having a high thermal durabiity, high microwave transmissivity, and small dielectric loss.

Disposed over the microwave window 14 is a dielectric substance layer 36, which is overlaid with a metallic plate 37 of aluminum, etc. The dielectric substance layer 36 is connected to a microwave generator 39 through a waveguide 38. The dielectric substance layer 36 is made of material having a small dielectric loss, e.g., fluorine resin, polyethylene or polystyrene. The microwave frequency is 2.45 GHz for example.

Disposed in the reaction room 12 at the position confronting the microwave window 14 is a sample stage 15, on which a sample S is placed. The sample stage 15 has a chuck mechanism such as an electrostatic chuck (not shown) for holding the sample S and a fluid circulating mechanism (not shown) for circulating a thermal medium for maintaining the sample S at a constant temperature. The sample stage 15 is connected to a RF voltage source 40, which is tuned to 400 kHz, 2 MHz, 13.56 MHz, etc.

The sample stage 15 is fixed to a base 16, while being insulated from the reaction chamber 11 by an insulating member 18, and surrounded by a plasma shielding member 17. The sample stage 15 is formed of an electrode main body, with molten alumina being sprayed on its surface, with the intention of providing a function of electrostatic chuck. The insulating member 18 and plasma shielding member 17 are made of alumina. The reaction chamber 11 has the formation of a gas feed duct 19a for feeding gas into the reaction room 12 and an evacuation port 20 which communicates with an evacuation device (not shown).

The microwave window 14 is provided on the lower surface thereof with a counter electrode 21 which has a number of rectangular microwave entry holes 21a. The counter electrode 21 is grounded electrically by way of the reaction chamber 11, and it serves as grounded electrode against the sample stage 15 to which RF voltage is applied. The counter electrode 21 is made of silicon (Si), aluminum, etc., and it is equipped with a heater 31.

Figure 4:
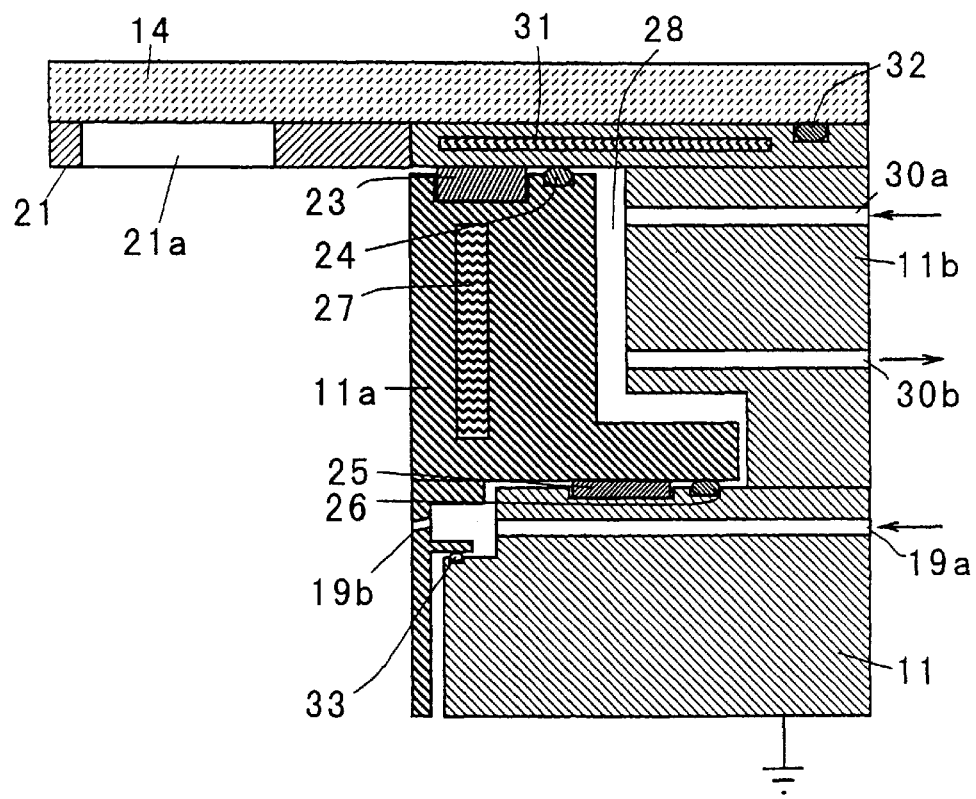
FIG. 4 is an enlarged view of portion B of the apparatus shown in FIG. 3, i.e., the side wall section of the reaction chamber.

FIG. 4 shows a detail of portion B of the apparatus shown in FIG. 3, i.e., the side wall section of the reaction chamber. The side wall of the reaction chamber 11 is mainly made up of an inner side wall 11a and an outer side wall 11b. The inner side wall 11a is made of aluminum, etc. coated on its interior surface with an anti-corrosion oxide film. The opposite surface, which faces the outer side wall 11b, of the inner side wall 11a may also be coated with the anti-corrosion oxide film so as to enhance the electrical separation between the inner side wall 11a and outer side wall 11b. The outer side wall 11b is made of aluminum, stainless steel, etc.

The inner side wall 11a and outer side wall 11b are isolated electrically and thermally from each other by separation means 23 and 25. These separation means are made of TEFLON (registered trademark for polytetrafluoroethylene) or ceramics such as alumina having a high electrical resistivity, low thermal conductivity and good fabricability. For the airtight sealing of the reaction room 12, the inner side wall 11a and outer side wall 11b are provided with insulator O-rings 24 and 26 of fluorine rubber, KALREZ (registered trademark for perfluoroelastomer), etc. The outer side wall 11b is grounded electrically, while the inner side wall 11a is not.

The inner side wall 11a has a buried heater 27 so that it can undergo temperature control based on heating. A cooling space 28 is formed between the inner side wall 11a and outer side wall 11b, with $N_2$ gas for example being fed into it from a cooling gas feed duct 30a and evacuated through an evacuation port 30b, so as to alleviate the temperature rise of the outer side wall 11b.

Processing gas is introduced from the gas feed duct 19a, and it is led into the reaction room 12 through a number of gas inlets 19b aligning around the inner side wall 11a. The inner side wall 11a and outer side wall 11b are interposed by an insulator O-ring 33, by which a gas feed space is formed around the inner side wall 11a.

The method of plasma processing on the surface of a sample S by use of the plasma processing apparatus arranged as described-above will be explained with reference to FIG. 3.

① The sample stage 15 is kept at a prescribed temperature, and the inner side wall 11a of the reaction chamber 11 is heated to a prescribed temperature in advance.

② Residual gas in the reaction room 12 is evacuated through the evacuation port 20, and processing gas is fed into the reaction room 12 through the gas feed duct 19a and inlets 19b.

③ The microwave generator 39 is activated to supply the microwave to the dielectric substance layer 36 through the waveguide 38. An electric field of plane wave is formed in the space 35, and the electric field penetrates into the reaction room 12 through the microwave window 14, causing the gas to form plasma.

④ Virtually simultaneously to the plasma generation, the RF voltage source 40 is activated to apply RF voltage to the sample stage 15, thereby producing a bias voltage on the surface of the sample S. The sample S is exposed to ion of plasma, while ion energy is controlled by the adjustment of bias voltage, and the sample S is processed.

RF voltage is applied to the sample stage 15, with the counter electrode 21 being grounded electrically and the inner side wall 11a being not grounded, and therefore RF voltage is applied efficiently between the sample stage 15 and counter electrode 21, so that the resulting bias voltage is stabilized thereby to improve the repeatability of plasma processing.

The inner side wall 11a is thermally isolated from other portions of the reaction chamber 11 based on the formation of the cooling space 28, and therefore it is rendered the efficient and stable temperature control exclusively. The outer side wall (facing to the atmosphere) of the reaction chamber is prevented from heating up, and it is free from the maintenance problem.

This plasma processing apparatus is suitable for such a process as etching of silicon oxide ($SiO_2$) films in which control of ion is especially crucial. Although the apparatus of this embodiment shown in FIGS. 3 and 4 is designed to heat the inner side wall 11a with the heater 27, an alternative design is to provide the inner side wall 11a with a thermal medium circulating path so that the wall can be heated and also cooled.

Figure 5:
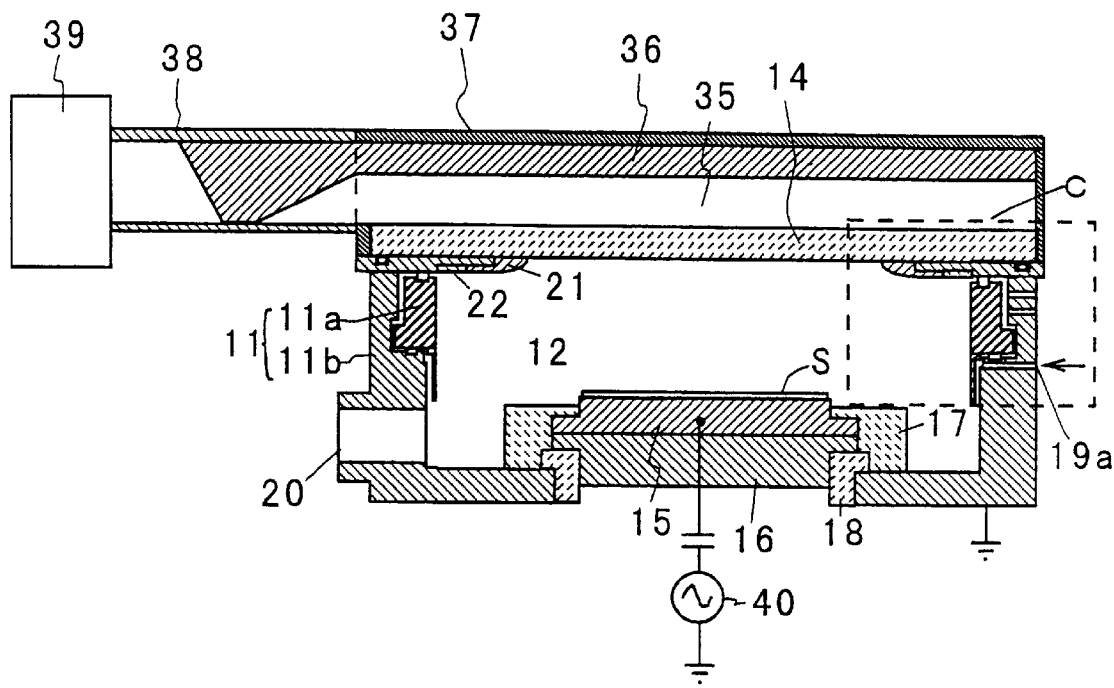
FIG. 5 is a vertical cross-sectional view of the plasma processing apparatus based on another embodiment of the present invention.

FIG. 5 shows a vertical cross-section of the plasma processing apparatus based on another embodiment of the present invention. The apparatus has an annular counter electrode 21 having nonexistent central portion immediately above the sample S. Only other difference from the preceding embodiment is the use of combined members for the separation between the inner side wall and outer side wall of the reaction chamber.

Figure 6:
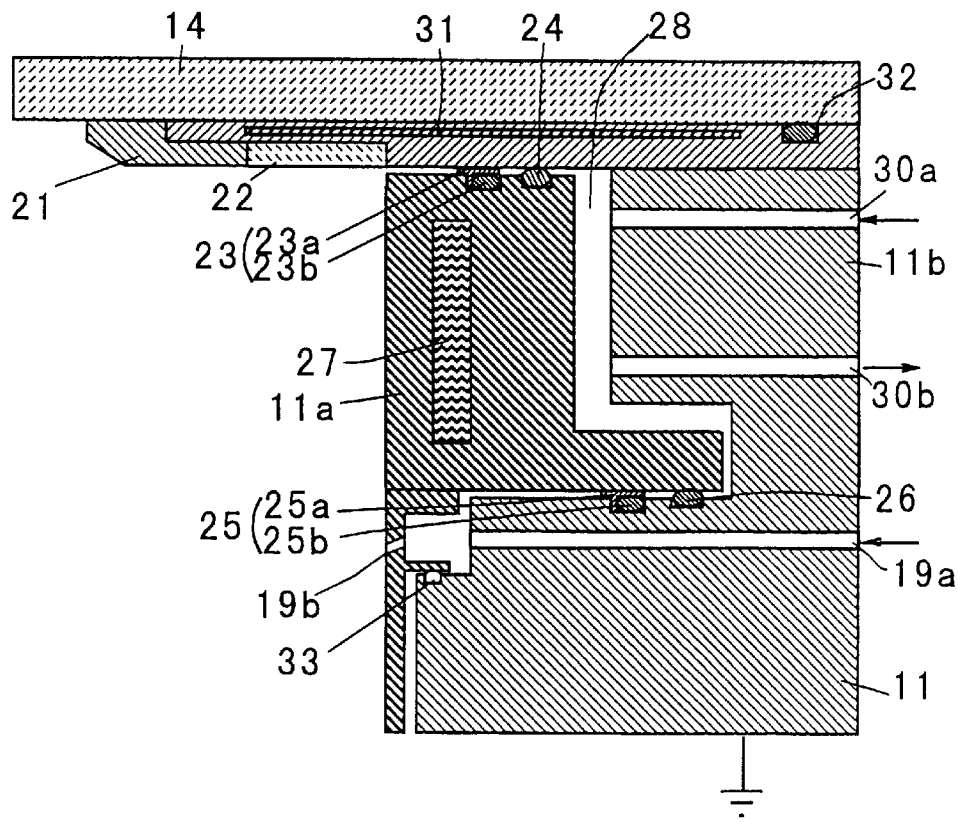
FIG. 6 is an enlarged view of portion C of the apparatus shown in FIG. 5, i.e., the side wall section of the reaction chamber.

FIG. 6 shows a detail of portion C of the apparatus shown in FIG. 5, i.e., the side wall section of the reaction chamber. The annular counter electrode 21 is provided on its outer edge section with an electrode rim insulating plate 22 of alumina, quartz, etc., and also equipped with a buried heater 31. Separation means 23 and 25 between the inner side wall 11a and outer side wall 11b include a combined member made up of a teflon packing 23a and O-ring 23b and another combined member made up of a teflon packing 25a and O-ring 25b. The packings 23a and 25a may be made of such ceramics as alumina, instead of teflon.

The use of the combined members including the resilient O-rings enables the separation means to be fitted evenly between the inner side wall 11a and outer side wall 11b. Consequently, the flow of heat between the inner side wall 11a and outer side wall 11b can easily be made even along the separation means, and the temperature distribution around the inner side wall 11a can easily be made even.

The apparatus shown in FIG. 5 can achieve the effective RF voltage application between the counter electrode 21 and sample stage 15 based on the inner side wall 11a being not grounded electrically, despite of the counter electrode 21 which exists only in the outer rim section of the microwave window 14. Consequently, it is capable of improving the repeatability of plasma processing as well as the apparatus shown in FIG. 3. In addition, it performs the efficient and stable temperature control for the inner side wall 11a and alleviates the temperature variation of the outer side wall 11b (facing to the atmosphere) so that the maintenance difficulty is dissolved.

Figure 7:
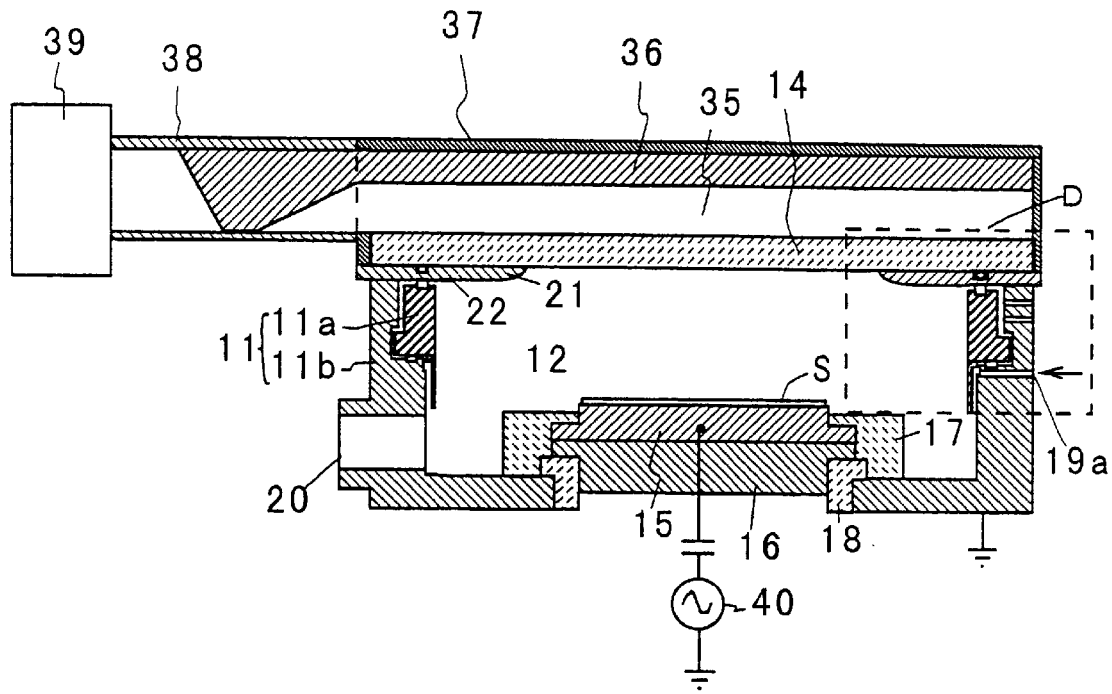
FIG. 7 is a vertical cross-sectional view of the plasma processing apparatus based on still another embodiment of the present invention.
Figure 8:
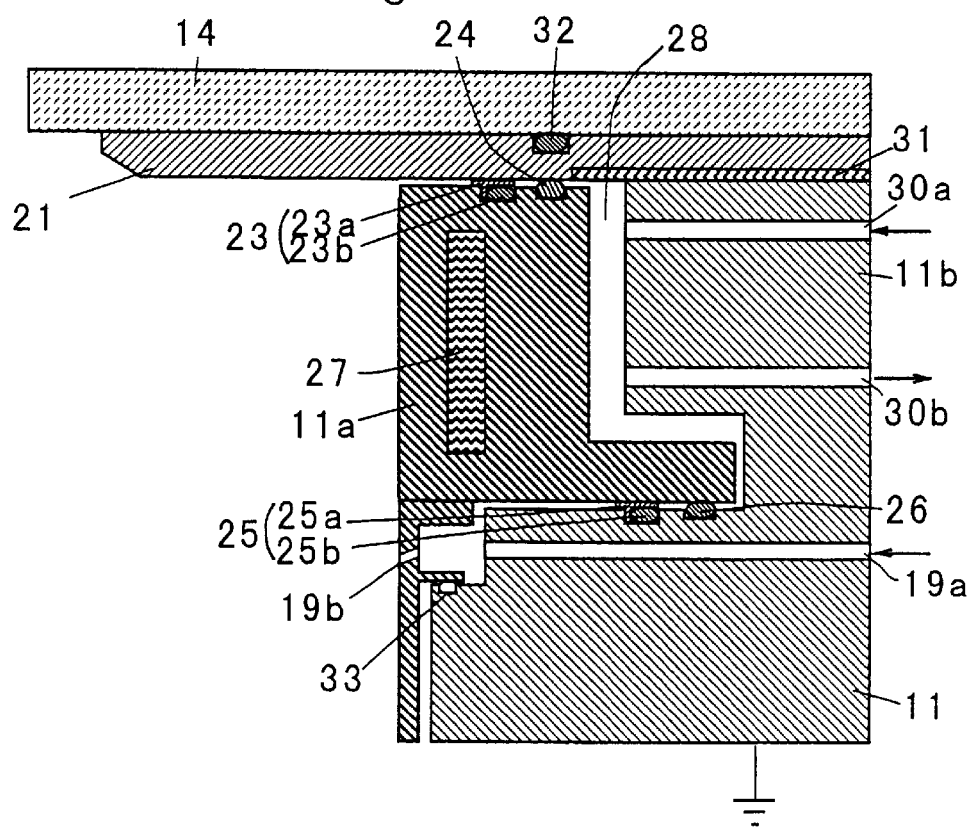
FIG. 8 is an enlarged view of portion D of the apparatus shown in FIG. 7, i.e., the side wall section of the reaction chamber.

FIG. 7 shows a vertical cross-section of the plasma processing apparatus based on still another embodiment of the present invention, and FIG. 8 shows a detail of portion D of the apparatus shown in FIG. 7, i.e., the side wall section of the reaction chamber.

The counter electrode 21 is formed as an integral part of the outer side wall 11b so that the structure is simple as shown in FIG. 7, in contrast to the counter electrodes 21 shown in FIG. 3 and FIG. 5 that are designed to be detachable. In case a heater 27 is equipped for the inner side wall 11a of the reaction chamber, the heater wire will behave to disperse RF power, and therefore it is desirable to use such a matching circuit or a isolation circuit as a RF cutoff filter thereby to prevent the dispersion.

Industrial Applicability

The plasma processing apparatus and plasma processing method of the present invention are capable of eliminating the dispersion of RF power from the sample stage toward the side wall of reaction chamber, which event has been encountered by the conventional apparatus, based on the electrical isolation of the inner side wall of reaction chamber and based on the inner side wall being not grounded. Consequently, the apparatus and method can achieve the effective RF voltage application between the counter electrode and sample stage, stabilizing the bias voltage which is produced on the sample surface by this voltage application and accordingly improving the repeatability of plasma processing.

The inner side wall, which is equipped with its own temperature control means, is isolated thermally from other portions of the reaction chamber, and this structure improves the temperature control performance for the inner side wall which confronts the reaction chamber and also improves the maintainability of the apparatus.

Accordingly, the plasma processing apparatus and plasma processing method of the present invention are suitable for the application of plasma processing to etching, ashing, CVD, etc. in the manufacturing of large scale integrated circuits (LSIs) and liquid crystal display panels (LCDs), and useful for the manufacturing of LSIs and LCDs.

What is claimed is:

1. A plasma processing apparatus comprising:
   means of supplying a microwave;
   an enclosed reaction chamber having a side wall, a ceiling and a floor;
   a microwave window provided in the ceiling of said reaction chamber;
   a sample stage disposed in said reaction chamber opposite said microwave window;
   means of applying RF voltage to said sample stage;
   a counter electrically grounded electrode which is located approximate to said microwave window; and
   the side wall having,
      an inner side wall, which is not electrically grounded, facing the interior of the reaction chamber,
      a temperature control means in the interior of the inner side wall capable of heating the inner side wall,
      an outer electrically grounded side wall facing the exterior of the reaction chamber,
      a means for thermally and electrically insulating the inner side wall from the outer side wall, said means having high electrical resistivity and low thermal conductivity.

2. A plasma processing apparatus according to claim 1, wherein said counter electrode is provided to exist in the rim section of said microwave window inside said reaction chamber.

3. A plasma processing method comprising the operational steps of:
   providing a plasma processing apparatus having:
      means of supplying a microwave,
      an enclosed reaction chamber having a side wall, a ceiling and a floor,
      a microwave window provided in the ceiling of said reaction chamber,
      a sample stage disposed in said reaction chamber opposite said microwave window,
      means of applying RF voltage to said sample stage, and
      a counter electrically grounded electrode which is located approximate to said microwave window,
      the side wall having,
         an inner side wall, which is not electrically grounded, facing the interior of the reaction chamber,
         a temperature control means in the interior of the inner side wall capable of heating the inner side wall,
         an outer electrically grounded side wall facing the exterior of the reaction chamber,
         a means for thermally and electrically insulating the inner side wall from the outer side wall, said means having high electrical resistivity and low thermal conductivity;
   heating the inner side wall to a prescribed temperature;
   feeding processing gas into the reaction chamber;
   introducing a microwave into the reaction chamber, thereby causing the gas to form a plasma; and
   applying RF voltage to a sample stage on which a sample is placed to produce a bias voltage on the sample surface so that said sample is exposed to ion and subsequently processed.

4. The plasma processing apparatus according to claim 1, in which the means for thermally and electrically insulating the inner side wall from the outer side wall is a non-metallic substance.

5. The plasma processing apparatus according to claim 1, in which the means for thermally and electrically insulating the inner side wall from the outer side wall is one selected from the group consisting of polytetrafluoroethylene and ceramics.

6. The plasma processing apparatus according to claim 1, in which insulator O-rings are placed between the inner side wall and the outer electrically grounded side wall of the plasma processing apparatus.

7. The plasma processing method according to claim 3, in which the means for thermally and electrically insulating the inner side wall from the outer side wall is a non-metallic substance.

8. The plasma processing method according to claim 3, in which the means for thermally and electrically insulating the inner side wall from the outer side wall is one selected from the group consisting of polytetrafluoroethylene and ceramics.

9. The plasma processing apparatus according to claim 3, in which insulator O-rings are placed between the inner side wall and the outer electrically grounded side wall of the plasma processing apparatus.

10. A plasma processing apparatus comprising:

an enclosed reaction chamber having a side wall, a ceiling and a floor;

a microwave generator;

a waveguide connected to said microwave generator for supplying a microwave into said enclosed reaction chamber;

a microwave window provided in the ceiling of said enclosed reaction chamber; and a sample stage disposed in said enclosed reaction chamber opposite said microwave window, the side wall having, an inner side wall, which is not electrically grounded, facing the interior of the reaction chamber, a heater in the interior of said inner side wall, an outer side wall, which is electrically grounded, facing the exterior of the reaction chamber, and a means for thermally and electrically insulating the inner side wall from the outer side wall, said means having high electrical resistivity and low thermal conductivity.

11. The plasma processing apparatus according to claim 10, wherein said side wall further having, a cooling space formed between said inner side wall and said outer side wall;

a gas feed duct for feeding a cooling gas to said cooling space; and a gas evacuation port for evacuating the cooling gas from said cooling space.

12. The plasma processing apparatus according to claim 10, in which the means for thermally and electrically insulating the inner side wall from the outer side wall is an insulating material selected from the group consisting of polytetrafluoroethylene and ceramics.

13. The plasma processing apparatus according to claim 10, further comprising:

means of applying RF voltage to said sample stage; and a counter electrically grounded electrode which is located approximate to said microwave window.

* * * * *